US006492878B1

(12) United States Patent
Rim et al.

(10) Patent No.: US 6,492,878 B1
(45) Date of Patent: Dec. 10, 2002

(54) HIGH VOLTAGE PULSE GENERATION DEVICE FOR MAGNETRON

(75) Inventors: Geun Hie Rim, Seoul (KR); Jong-Soo Kim, Kyangnam (KR); Won-Ho Kim, Pusan (KR); Iou-Ri Kan, Petersburg (RU)

(73) Assignee: Korea Electrotechnology Research Institute (KR)

( * ) Notice: Subject to any disclaimer, the term of this patent is extended or adjusted under 35 U.S.C. 154(b) by 0 days.

(21) Appl. No.: 09/720,539

(22) PCT Filed: Jun. 22, 1999

(86) PCT No.: PCT/KR99/00328

§ 371 (c)(1), (2), (4) Date: Mar. 2, 2001

(87) PCT Pub. No.: WO99/67875

PCT Pub. Date: Dec. 29, 1999

(30) Foreign Application Priority Data

Jun. 23, 1998 (KR) .......................................... 98/23755

(51) Int. Cl.[7] .......................................... H03B 9/10
(52) U.S. Cl. .......................................... 331/87; 363/17
(58) Field of Search ............................ 331/87; 363/17; 315/248, 223

(56) References Cited

U.S. PATENT DOCUMENTS 4,318,165 A * 3/1982 Kornrumpf et al. ........ 219/761
4,399,376 A 8/1983 Onodera et al. ............ 307/415
4,473,778 A 9/1984 Adachi ....................... 315/101
4,628,284 A * 12/1986 Bruning et al. ............. 331/186
4,684,820 A * 8/1987 Valencia ..................... 307/106
5,514,918 A 5/1996 Inatomi et al. ............. 307/106
5,933,335 A * 8/1999 Hitchcock et al. .......... 315/408
5,990,633 A * 11/1999 Hirschmann et al. ....... 315/278
6,061,252 A * 5/2000 Hosotani .................... 363/134
6,304,461 B1 * 10/2001 Walker ....................... 363/127

FOREIGN PATENT DOCUMENTS

DE WO 98/18297 * 4/1998
EP 0 343 890 A2 5/1989 .................... 61/54
EP 0 450 523 A1 3/1991 .................... 41/19
JP 10-76182 3/1998 ...................... 3/68

OTHER PUBLICATIONS

"Pulse Power Source Device for Electronic Dust Collector," Tomaki Teruo, Mar. 24, 1998, 2 pages.

* cited by examiner

*Primary Examiner*—Robert Pascal
*Assistant Examiner*—Joseph Chang
(74) *Attorney, Agent, or Firm*—Howrey Simon Arnold & White, LLP

(57) ABSTRACT

A high voltage pulse generation device for magnetron is disclosed. The device is divided into a DC voltage generation part, which continuously applies a variable DC voltage at a constant value to the load, and a pulse voltage generation part, which generates a momentary high voltage pulse and supplies the same to the load. The voltage applied to the load is a superposition of the output voltages from the two devices. Further, a pulse transformer demagnetization power supply is provided. A high voltage pulse waveform is obtained by momentary resonance and the pulse transformer using a low voltage at the time of pulse generation, thereby reducing the insulation space required and the size and the weight of the device. It is also possible to adjust the peak value and pulse cycle of the DC voltage applied to the load in addition to the pulse voltage.

15 Claims, 2 Drawing Sheets

HIGH VOLTAGE PULSE GENERATION DEVICE FOR MAGNETRON

CROSS-REFERENCE TO RELATED APPLICATIONS

This application claims priority under 35 U.S.C. §119 to International Application No. PCT/KR/00328, filed on Jun. 22, 1999 under the Patent Cooperation Treaty, which claims priority to Korean patent Application No. 1998/23755, filed Jun. 23, 1998.

TECHNICAL FIELD

The present invention relates to a high voltage pulse generation device for a magnetron. The high voltage pulse generation device comprises a power supply in which a high voltage pulse is super-positioned onto the DC voltage, wherein the magnetron is driven by generating a high voltage pulse using a pulse transformer and a resonance circuit.

BACKGROUND ART

A conventional high voltage pulse generation device is constructed in such a manner that a high pulse is generated by switching a DC power supply using a thyristor diode module (hereinafter TDM) and by having a resonant circuit at the TDM output.

A high voltage is applied to the TDM output because the TDM output is directly applied to the load via the resonant circuit. This is a disadvantage in that the cost of the device is increased due to the high voltage rating required of all the components in the circuit.

Therefore, the present invention relates to providing a relatively inexpensive high voltage pulse generation device by using a low voltage circuit to generate high voltage pulses.

Further, the present invention relates to providing a high voltage pulse generation device having reduced insulation space requirements and reduced weight.

DISCLOSURE OF INVENTION

To overcome the defects of the prior art, the high voltage pulse generation device of the present invention is constructed in such a manner that a high voltage switch is placed at the primary side of a transformer, a resonant circuit is constructed from components on the primary and secondary sides of the transformer, with a high voltage pulse being applied to the load at the secondary side of the transformer.

More specifically, the circuit presented herein is divided into two parts, which respectively generate different types of voltages. A first DC voltage generation part continuously applies a variable DC voltage at a required value to the load. A second pulse voltage generation part generates a momentary high voltage pulse and supplies the same to the load. The voltage applied to the load is the super position of the output voltages of the two parts. The circuit also includes a pulse transformer demagnetization power supply, which is constructed separately from the pulse voltage generation part, and which resets the pulse transformer core flux after pulse generation.

A high voltage pulse generation circuit is usually constructed with a resonant circuit and a high voltage switching arrangement. However, present invention generates a high voltage pulse waveform through a pulse transformer and momentary resonance by using low voltage pulse generator, which results in a different resonant circuit construction. Because of the low voltage components, the required insulation space is reduced thereby reducing the size and the weight of the circuit as compared with conventional circuits. Further, when necessary, the pulse generation circuit can adjust the peak value, number of the pulses, and the DC voltage applied to the load. The pulse width and other pulse parameters may be varied by adjusting the component values in the design of the circuit. Additionally, a thyristor diode module is used as a semiconductor switching element for resonance generation, which simplifies the control and system construction resulting in manufacturing advantages.

The power supply for the high voltage pulse generator is a DC voltage obtained by rectification from an AC power supply. The resonant circuit is constructed by connecting a resonant inductor to the primary side of a high frequency transformer and a resonant capacitor to the secondary side. The resonance current begins to flow as the thyristor of the TDM cycled at the design frequency. A separate complex switching operation is not required because of the backward flow of current through the diode of the TDM from the moment that the resonance current changed.

The pulse transformer demagnetization power supply controls the residual magnetism of the pulse transformer after a pulse generation, preventing saturation of the pulse transformer.

To switch a high voltage, several elements must be connected in series because of the limited voltage and current rating of the elements. In the present invention, several TDMs are serially connected, each TDM consisting of a thyristor and a diode connected in anti-parallel. Further, the DC base voltage applied to the load is supplied by a separate variable DC power supply circuit.

DETAILED DESCRIPTION OF PREFERRED EMBODIMENTS

Figure 1:
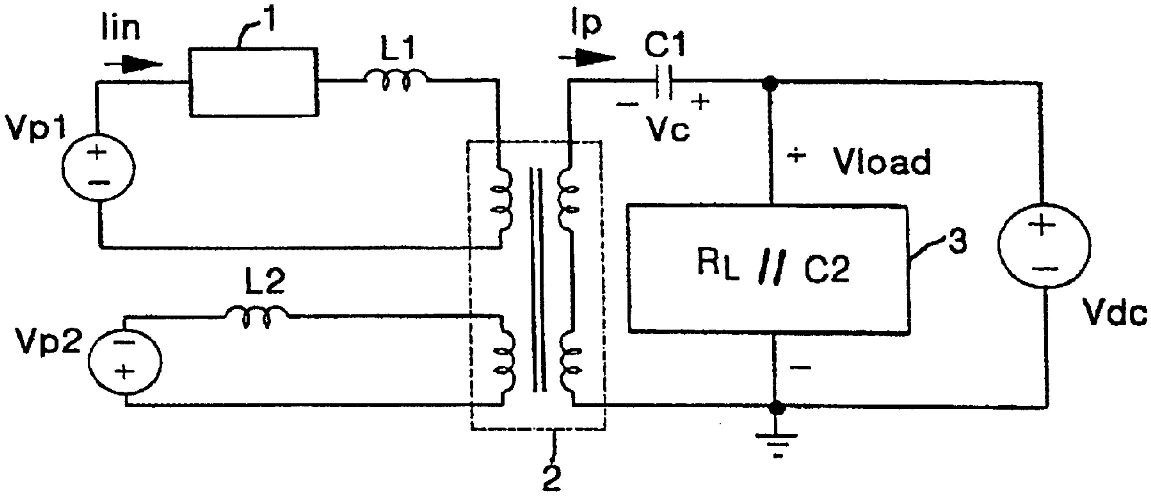
FIG. 1 is a circuit diagram of a high voltage pulse generation device for a magnetron according to the present invention.

Construction and operation of the present invention are described in detail with reference to accompanying drawings as follows:

FIG. 1 is a circuit diagram of a pulse voltage generation circuit in accordance with the present invention. Thyristor diode module ("TDM") (1) periodically interrupts an input dc power supply (Vp1) with an on-off operation. Resonant inductor (L1), which forms a resonant circuit with resonant capacitor (C1), is connected between TDM (1) and the primary winding of pulse transformer (2), which transforms the relatively low input dc voltage to a high voltage. Resonant capacitor (C1) is connected in series with the secondary winding of pulse transformer (2) and connects to the load (3). Variable dc voltage source (Vdc) is connected across load t(3) for supplying the predetermined dc voltage to the load (3). Finally, transformer demagnetization power supply (Vp2) is connected to pulse transformer (2) for controlling the residual magnetic flux of the transformer after pulse generation.

Figure 2:
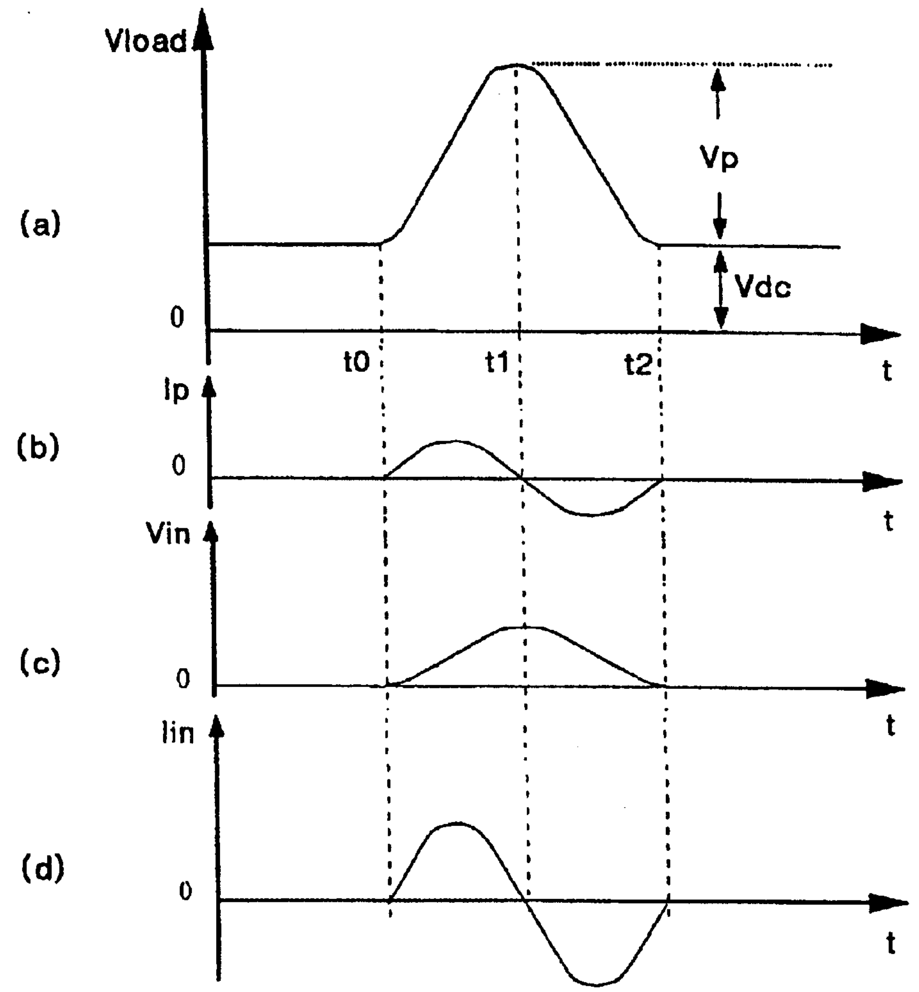
FIG. 2 is a wave diagram of the voltage and current applied to the load, along with the input voltage and current at the time of a pulse generation in the circuit according to the present invention.

FIG. 2 shows the voltage and current waveforms of the circuit illustrated in FIG. 1. With reference to FIG., 2(*a*), at an initial state, resonant capacitor (C1) is charged with a voltage (Vdc) provided by the variable DC power supply. When the thyristor diode module (1) becomes conductive at $t=t_0$, resonance is generated at the resonant capacitor (C1) by the power supply provided from the input through the pulse transformer. While thyristor diode module (1) is conducting, a series resonant circuit is formed comprising resonant Inductor (L1), connected on the primary side of the pulse transformer, resonant capacitor (C1) connected on the secondary side of the pulse transformer, and the load. At time $t=t_1$, the pulse voltage reaches its peak, and the current flowing through the TDM is zero. The direction of the current then changes, and reverse current starts to flow via the diode of the TDM (1). At that time, the thyristor is turned off by the reverse current flow, and remains off until the current through the diode portion of the thyristor diode module (1) returns to zero, terminating resonance. The above process is repeated with the desired pulse frequency.

The peak value of a pulse generated by the resonant circuit can be calculated based on the following equation:

$$R_L >> n\sqrt{\frac{L\cdot(C1+C2)}{C1\cdot C2}} \tag{1}$$

wherein, n is a ratio between the number of turns on the primary side of the pulse transformer to the number of turns of the secondary side; C1 is the capacitance of the resonant capacitor; C2 is the load capacitance; and $R_L$ is the load resistance.

The current flowing through the secondary winding of the high transformer is represented by the following equation:

$$I_p = \frac{nV_{pi}}{\rho}\sin\omega t \tag{2}$$

wherein, $$\omega = 1/n\sqrt{\frac{L\cdot(C1+C2)}{C1\cdot C2}};$$

and P is the equivalent impedance of the main circuit. The voltage applied to the load is as follows:

$$V_{load} = \frac{I_{max}}{C2\cdot\omega}(1-\cos\omega t) \tag{3}$$

The peak value of the pulse voltage is then expressed by:

$$V_{p\text{-}peak} = 2nV_{pi}\frac{C1}{(C1+C2)} \tag{4}$$

In FIG. 2, at the load, the pulse voltage ($V_p$) is superpositioned at the moment of resonance on the constant DC voltage ($V_{dc}$).

As compared to conventional methods of pulse generation, the pulse generation circuit used in the present system can be miniaturized even further by reducing the insulating space of a pulse transformer (2).

Figure 3:
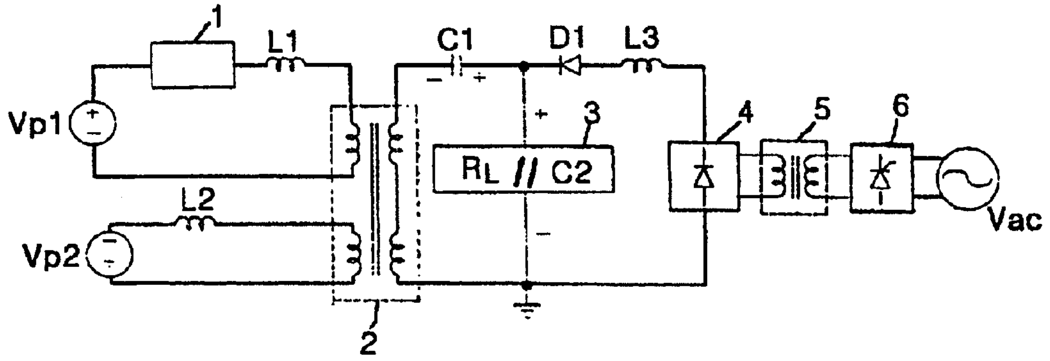
FIG. 3 is a circuit diagram of a different construction of a variable DC power supply device for use in a high pulse generation device for magnetron of FIG. 1.

FIG. 3 is a circuit diagram, according to the present invention, having a differently constructed a variable DC power supply device at the main circuit. The variable DC power supply device ($V_{dc}$) comprises phase control voltage converter (6), transformer (5), rectifier (4), and a pulse inflow prevention diode (D1). The voltage supplied to the load is therefore constant. The phase control voltage converter (6) controls the voltage magnitude by phase control using a non-thyristor switch capable of non-zero current turn-off.

According to the present invention, a high voltage pulse waveform is obtained by momentary resonance using a pulse transformer and a low voltage from a pulse voltage generation circuit. As such, the insulation space required may be reduced, thereby reducing the size and the weight thereof.

Additional modifications and adaptations of the invention described herein may be made that would be obvious to one of ordinary skill in the art. It is intended that the appended claims embrace the embodiments in the foregoing description, as well as the referenced modifications.

What is claimed is:

1. A high voltage pulse generation device comprising:

(a) a pulse transformer having a first primary side winding, a second primary side winding, and a secondary side winding;

(b) a first primary side circuit comprising:

(b-1) a first inductor having a first terminal connected to a first terminal of said first primary side winding;

(b-2) a thyristor-diode module having a first terminal connected to a second terminal of said inductor;

(b-3) a first DC power supply having a first terminal connected to a second terminal of said thyristor-diode module and having a second terminal connected to a second terminal of said first primary side winding;

(c) a second primary side circuit comprising:

(c-1) a secondary inductor having a first terminal connected to a first terminal of said second primary side winding;

(c-2) a secondary DC power supply having a first terminal connected to a second terminal of said secondary inductor and having a second terminal connected to a second terminal of said second primary side winding; and (d) a secondary side circuit comprising:

(d-1) a capacitor having a first terminal connected to a first terminal of said secondary side winding;

(d-2) a load having a first terminal connected to a second terminal of said capacitor and a second terminal connected to a second terminal of said secondary side winding;

(d-3) a third DC power supply connected in parallel with said load.

2. A high voltage pulse generation device according to claim 1, wherein said third DC power supply comprises:

(d-3-1) an alternating current power supply;

(d-3-2) a phase control voltage converter having an input connected to said alternating current power supply;

(d-3-3) a high voltage transformer having a primary side connected to an output of said phase control voltage converter;

(d-3-4) a rectifier having an input connected to a secondary side of said high voltage transformer, and having a first output terminal coupled to a first terminal of said load; and (d-3-5) a diode having an anode connected to a second output terminal of said rectifier and having a cathode coupled to a second terminal of said load.

3. A high voltage pulse generating circuit comprising:

a low voltage pulse generating circuit comprising a low voltage DC power supply and a switch coupled in series with said power supply;

a high frequency transformer having a primary winding and a secondary winding, the primary winding coupled to receive a pulse generated by the low voltage pulse generating circuit and the secondary winding coupled to deliver the pulse to a load;

a resonant circuit comprising one or more components connected to the nary winding and one or more components coupled to the secondary winding; and a variable DC voltage source coupled to the load, wherein the variable DC voltage source further comprises:

an AC power source;

a phase controlled voltage coupled converter having an input coupled to said AC power source;

a power supply transformer having a first winding coupled to an output of said phase controlled voltage converter; and a pulse inflow prevention diode coupled between a secondary winding of the power supply transformer and the load.

4. A high voltage pulse generation circuit comprising:

a low voltage pulse generating circuit comprising a low voltage DC power supply and a switch coupled in series with said power supply;

a high frequency transformer having a primary winding and a secondary winding, the primary winding coupled to receive a pulse generated by the low voltage pulse generating circuit and the secondary winding coupled to deliver the pulse to a load; and a resonant circuit comprising one or more components connected to the primary winding and one or mote components coupled to the secondary winding; and a transformer demagnetization power supply coupled to the transformer.

5. The high voltage pulse generating circuit of claim 4 wherein the switch comprises a thyristor diode module.

6. The high voltage pulse generating circuit of claim 4 wherein the switch comprises a plurality of series-connected thyristor diode modules.

7. The high voltage pulse generating circuit of claim 4 fiber comprising a variable DC voltage source coupled to the load.

8. The high voltage pulse generating circuit of claim 7 wherein the variable DC voltage source comprises:

an AC power source;

a phase controlled voltage coupled converter having an input coupled to said AC power sources a power supply transformer having a first winding coupled to an output of said phase controlled voltage converter; and a pulse inflow prevention diode coupled between a secondary winding of the power supply transformer and the load.

9. The high voltage pulse generating circuit of claim 4 wherein the low voltage DC power supply comprises an AC power supply and a rectifier.

10. The high voltage pulse generating circuit of claim 9 wherein the resonant circuit comprises:

an inductor coupled between the low voltage pulse generating circuit and the primary winding of the transformer and a capacitor coupled between the secondary winding of the transformer and the load.

11. The high voltage pulse generating circuit of claim 10 wherein the switch comprises a thyristor diode module.

12. The high voltage pulse generating circuit of claim 10 wherein the switch comprises a plurality of series-connected thyristor diode modules.

13. The high voltage pulse generating circuit of claim 4 wherein the resonant circuit comprises:

an inductor coupled between the low voltage pulse generating circuit and the primary winding of the transformer and a capacitor coupled between the secondary winding of the transformer and the load.

14. The high voltage pulse generating circuit of claim 13 wherein the switch comprises a thyristor diode module.

15. The high voltage pulse generating circuit of claim 13 wherein the switch comprises a plurality of series-connected thyristor diode modules.

* * * * *

UNITED STATES PATENT AND TRADEMARK OFFICE

CERTIFICATE OF CORRECTION

PATENT NO. : 6,492,878 B1
DATED : December 10, 2002
INVENTOR(S) : Geun Hie Rim et al.

It is certified that error appears in the above-identified patent and that said Letters Patent is hereby corrected as shown below:

Column 5,
Line 11, please delete "nary" and insert -- primary --

Column 6,
Line 2, please delete "fiber" and insert -- further --
Line 8, please delete "sources" and insert -- source; --

Signed and Sealed this

Eighth Day of April, 2003

JAMES E. ROGAN
*Director of the United States Patent and Trademark Office*